(12) United States Patent
Chen et al.

(10) Patent No.: US 9,111,954 B2
(45) Date of Patent: Aug. 18, 2015

(54) POWER CONVERSION MODULE

(75) Inventors: Da-Jung Chen, Hsinchu (TW); Kaipeng Chiang, Hsinchu (TW); Yu-Chao Fang, Hsinchu (TW); Yi-Cheng Lin, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 976 days.

(21) Appl. No.: 13/180,292

(22) Filed: Jul. 11, 2011

(65) Prior Publication Data

US 2012/0069529 A1  Mar. 22, 2012

(30) Foreign Application Priority Data

Sep. 21, 2010  (TW) .............................. 99132089 A

(51) Int. Cl.
| | | |
|---|---|---|
| H05K 7/02 | (2006.01) | |
| H05K 7/06 | (2006.01) | |
| H05K 7/08 | (2006.01) | |
| H05K 7/10 | (2006.01) | |
| H01L 23/64 | (2006.01) | |
| H01L 23/552 | (2006.01) | |
| H01L 25/07 | (2006.01) | |
| H02M 3/155 | (2006.01) | |
| H02M 7/00 | (2006.01) | |
| H01L 23/00 | (2006.01) | |

(52) U.S. Cl.
CPC ............ *H01L 23/645* (2013.01); *H01L 23/552* (2013.01); *H01L 25/072* (2013.01); *H02M 3/155* (2013.01); *H02M 7/003* (2013.01); *H01L 24/16* (2013.01); *H01L 24/48* (2013.01); *H01L 2224/16225* (2013.01); *H01L 2224/16227* (2013.01); *H01L 2224/16235* (2013.01); *H01L 2224/48091* (2013.01); *H01L 2224/48227* (2013.01); *H01L 2924/1904* (2013.01); *H01L 2924/19042* (2013.01); *H01L 2924/19102* (2013.01); *H01L 2924/19105* (2013.01); *H01L 2924/3025* (2013.01)

(58) Field of Classification Search
USPC .................. 361/760–784, 790; 257/685–692, 257/723–730, 787–790
See application file for complete search history.

(56) References Cited

U.S. PATENT DOCUMENTS

| | | | | |
|---|---|---|---|---|
| 6,607,937 | B1 * | 8/2003 | Corisis .......................... | 438/108 |
| 6,885,278 | B2 * | 4/2005 | Nakao et al. .................. | 336/200 |
| 7,247,934 | B2 * | 7/2007 | Pu ................................. | 257/686 |
| 8,653,637 | B2 * | 2/2014 | Kim et al. ..................... | 257/686 |
| 2005/0006745 | A1 * | 1/2005 | Nishimura .................... | 257/686 |
| 2008/0303125 | A1 | 12/2008 | Chen et al. | |
| 2011/0134613 | A1 * | 6/2011 | Moussaoui et al. ........... | 361/737 |
| 2011/0228507 | A1 * | 9/2011 | Yin et al. ...................... | 361/811 |

\* cited by examiner

*Primary Examiner* — Tuan T Dinh
(74) *Attorney, Agent, or Firm* — Ming-Lee Teng; Litron Patent & Trademark Office

(57) ABSTRACT

A power conversion module includes a circuit carrier board, a semiconductor module and an inductor module. The circuit carrier board has plural bonding pads. The semiconductor module is disposed on a first surface of the circuit carrier board. The inductor module has plural pins. The pins are extended from the inductor module along a first direction and connected with corresponding bonding pads on the circuit carrier board, so that a receptacle is defined between the inductor module and the circuit carrier board for accommodating the semiconductor module.

11 Claims, 6 Drawing Sheets

POWER CONVERSION MODULE

FIELD OF THE INVENTION

The present invention relates to a power conversion module, and more particularly to a small-sized power conversion module.

BACKGROUND OF THE INVENTION

In electronic engineering technologies, a DC-to-DC converter is a common power conversion module that converts a DC voltage to another DC voltage. Recently, as the electronic device is developed toward miniaturization, a three-dimensional layout configuration of the DC-to-DC converter is gradually adopted in order to effectively reduce the area of the circuit carrier board.

FIGS. 1A and 1B are schematic exploded and side views illustrating a conventional DC-to-DC converter, respectively. In the DC-to-DC converter, a printed circuit board is used as a circuit carrier board 10. Many electronic components (e.g. a semiconductor IC chip 11 and several passive components 12) are mounted on the circuit carrier board 10. In addition, four post-like or ball-like structures 101 are formed on the corners of the circuit carrier board 10. An inductor 13 is soldered on the four post-like or ball-like structures 101. After the inductor 13 is soldered and supported on the four post-like or ball-like structures 101, a receptacle 19 is defined between the inductor 13 and the circuit carrier board 10. The semiconductor IC chip 11 and the passive components 12 are accommodated within the receptacle 19. As such, the three-dimensional layout configuration of the DC-to-DC converter is achieved.

Although the three-dimensional layout configuration may reduce the area of the circuit carrier board, there are still some drawbacks. For example, since an additional process is required to form the four post-like or ball-like structures 101 on the circuit carrier board 10, the material cost and the fabricating cost will be increased. Moreover, due to the inductor 13, the electronic components on the circuit carrier board 10 are usually suffered from an electromagnetic interference (EMI) problem. Under this circumstance, the performance and operating efficiency of the DC-to-DC converter are usually unsatisfied.

SUMMARY OF THE INVENTION

In accordance with an aspect, the present invention provides a power conversion module. The power conversion module includes a circuit carrier board, a semiconductor module and an inductor module. The circuit carrier board has plural bonding pads. The semiconductor module is disposed on a first surface of the circuit carrier board. The inductor module has plural pins. The pins are extended from the inductor module along a first direction and connected with corresponding bonding pads on the circuit carrier board, so that a receptacle is defined between the inductor module and the circuit carrier board for accommodating the semiconductor module.

In accordance with another aspect, the present invention provides a power conversion module. The power conversion module includes a circuit carrier board, a semiconductor module and an inductor module. The circuit carrier board has plural perforations. A first surface and a second surface of the circuit carrier board are in communication with each other through the perforations. The semiconductor module is disposed on the first surface of the circuit carrier board. The inductor module has plural pins. The pins are extended from the inductor module along a first direction, penetrated through corresponding perforations and fixed on the circuit carrier board, so that a receptacle is defined between the inductor module and the circuit carrier board for accommodating the semiconductor module.

In accordance with a further aspect, the present invention provides a power conversion module. The power conversion module includes a circuit carrier board, a semiconductor module and an inductor module. The circuit carrier board has a first surface and a second surface. The semiconductor module is disposed on a first surface of the circuit carrier board. The inductor module has plural L-shaped pins with respective horizontal parts and respective vertical parts. The vertical parts of the L-shaped pins are extended from the inductor module along a first direction. The horizontal parts of the L-shaped pins are soldered on the second surface of the circuit carrier board, so that a receptacle is defined between the inductor module and the circuit carrier board for accommodating the semiconductor module.

In accordance with a further aspect, the present invention provides a power conversion module. The power conversion module includes a circuit carrier board, a semiconductor module and an inductor module. The circuit carrier board has plural pins extended along a first direction. The semiconductor module is disposed on a first surface of the circuit carrier board. The inductor module having plural bonding pads. The bonding pads and corresponding pins of the circuit carrier board are electrically connected with each other, so that a receptacle is defined between the inductor module and the circuit carrier board for accommodating the semiconductor module.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION OF THE PREFERRED EMBODIMENT

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

For obviating the drawbacks encountered from the prior art, the present invention provides a power conversion module with low electromagnetic interference. In comparison with the prior art, the process of fabricating power conversion module of the present invention is time-saving and simplified. The present invention will now be described more specifically with reference to the following embodiments.

Figure 1A:
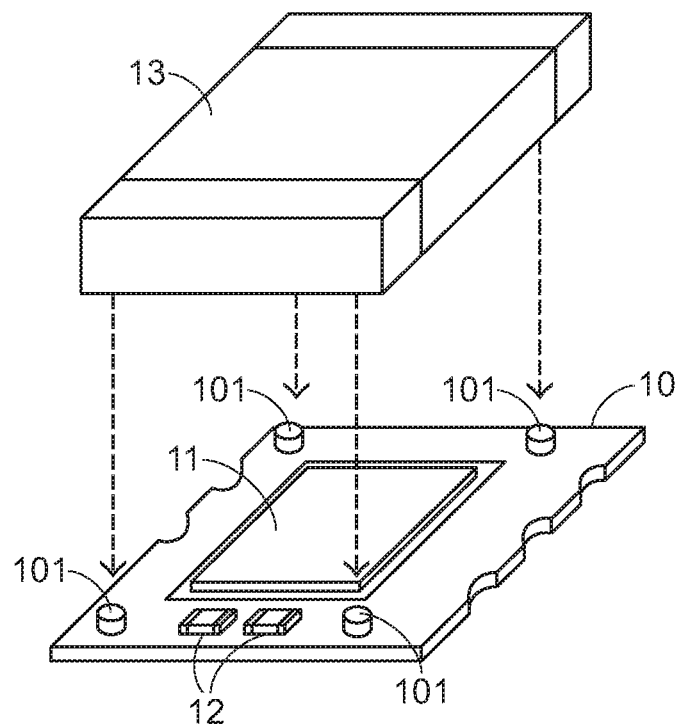
FIGS. 1A and 1B are schematic exploded and side views illustrating a conventional DC-to-DC converter, respectively.
Figure 1B:
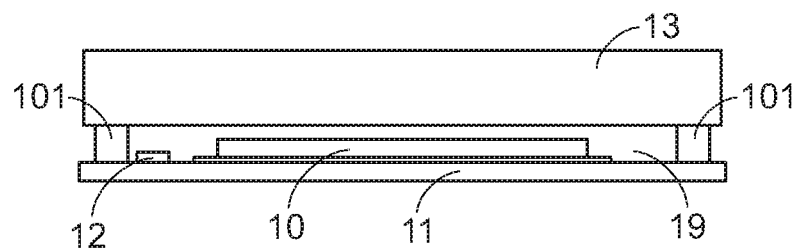
Figure 2:
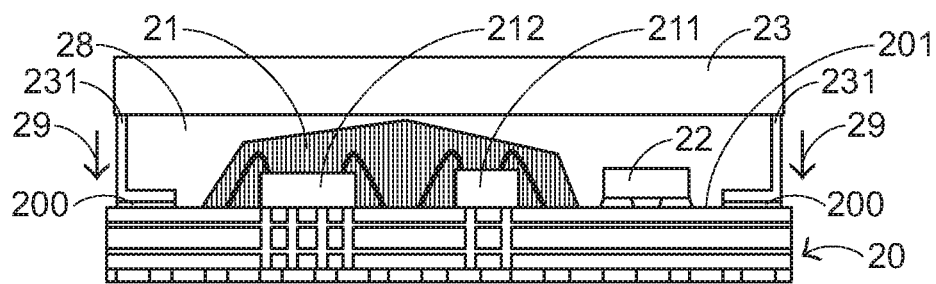
FIG. 2 is a schematic side view illustrating a DC-to-DC converter according to a first embodiment of the present invention.

FIG. 2 is a schematic side view illustrating a DC-to-DC converter according to a first embodiment of the present invention. As shown in FIG. 2, the DC-to-DC converter comprises a circuit carrier board 20, a semiconductor module 21, a passive component 22 and an inductor module 23. Plural bonding pads 200 are formed on the circuit carrier board 20. The semiconductor module 21 and the passive component 22 are mounted on a first surface 201 of the circuit carrier board 20. In addition, plural pins 231 are extended from the inductor module 23 along a first direction 29. The pins 231 are electrically connected with corresponding bonding pads 200 on the circuit carrier board 20. In such way, a receptacle 28 is defined between the inductor module 23 and the circuit carrier board 20 for accommodating the semiconductor module 21 and the passive component 22. Moreover, the plural pins 232 extended from the inductor module 23 along the first direction 29 are simultaneously produced during the inductor module 23 is fabricated; and the bonding pads 200 and bonding pads for other electronic components are simultaneously produced during the circuit carrier board 20 is fabricated. Since no additional procedures is required to produce the pins 232 and the bonding pads 200, the fabricating process of the DC-to-DC converter of the present invention is simplified when compared with the prior art.

Please refer to FIG. 2 again. In this embodiment, the semiconductor module 21 comprises a semiconductor chip 211 in a form of a bare die and a power transistor 212. The semiconductor chip 211 and the power transistor 212 are electrically connected with the circuit carrier board 20 in a wire bonding manner. In addition, the semiconductor chip 211 and the power transistor 212 are fixed on the first surface 201 of the circuit carrier board 20 by a plastic molding process. Moreover, in this embodiment, the pins 231 are L-shaped pins. Each of the L-shaped pins 231 has a horizontal part and a vertical part. The vertical part is parallel with the first direction 29. The horizontal part of the L-shaped pin 231 is soldered on a corresponding bonding pad 200.

Figure 3:
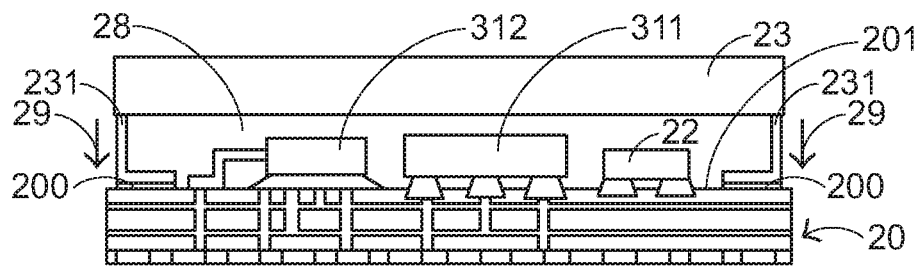
FIG. 3 is a schematic side view illustrating a DC-to-DC converter according to a second embodiment of the present invention.

FIG. 3 is a schematic side view illustrating a DC-to-DC converter according to a second embodiment of the present invention. The configurations of the circuit carrier board 20, the passive component 22 and the inductor module 23 included in FIG. 3 are similar to those shown in FIG. 2, and are not redundantly described herein. In this embodiment, the semiconductor module 31 comprises a semiconductor chip 311 and a power transistor 312. The semiconductor chip 311 and the power transistor 312 are respectively packaged and have respective terminals. According to a surface mount technology (SMT), the semiconductor chip 311 and the power transistor 312 can be directly soldered on the first surface 201 of the circuit carrier board 20. An example of the circuit carrier board 20 includes but is not limited to a printed circuit board (PCB), a metal core printed circuit board (MCPCB), a ceramic substrate or a direct bond copper (DBC) substrate.

Figure 4:
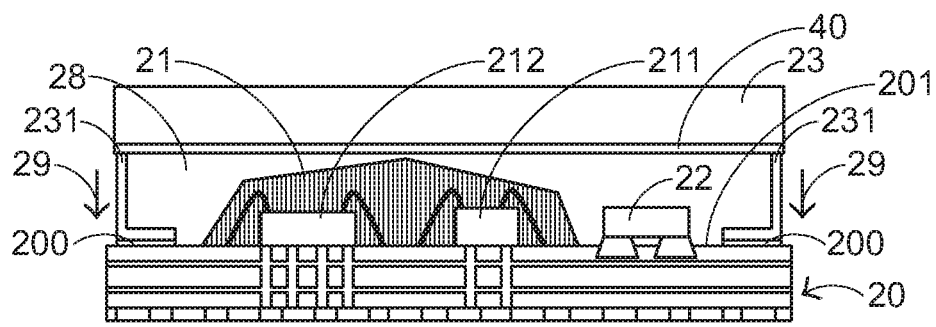
FIG. 4 is a schematic side view illustrating a DC-to-DC converter according to a third embodiment of the present invention.

FIG. 4 is a schematic side view illustrating a DC-to-DC converter according to a third embodiment of the present invention. In comparison with the first embodiment of FIG. 2, a shielding layer 40 is formed on a surface of the inductor module 23 facing the receptacle 28. The shielding layer 40 is a metallic sheet made of electromagnetic shielding material (e.g. copper or aluminum) for isolating or decreasing the influence of the electromagnetic interference (EMI) from the inductor module 23 on other circuits. Since the shielding layer 40 may be simultaneously produced during the inductor module 23 is fabricated, the assembling complexity is not increased.

Figure 5:
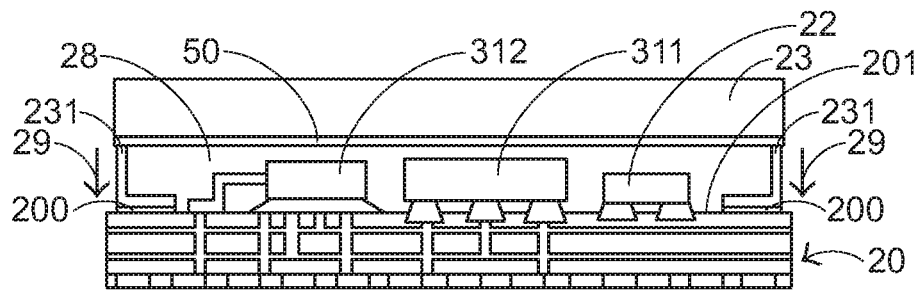
FIG. 5 is a schematic side view illustrating a DC-to-DC converter according to a fourth embodiment of the present invention.

FIG. 5 is a schematic side view illustrating a DC-to-DC converter according to a fourth embodiment of the present invention. In comparison with the second embodiment of FIG. 3, a shielding layer 50 is formed on a surface of the inductor module 23 facing the receptacle 28. The shielding layer 50 is a metallic sheet made of electromagnetic shielding material (e.g. copper or aluminum) for isolating or decreasing the electromagnetic interference (EMI) from other circuits. Since the shielding layer 50 may be simultaneously produced during the inductor module 23 is fabricated, the assembling complexity is not increased.

Figure 6:
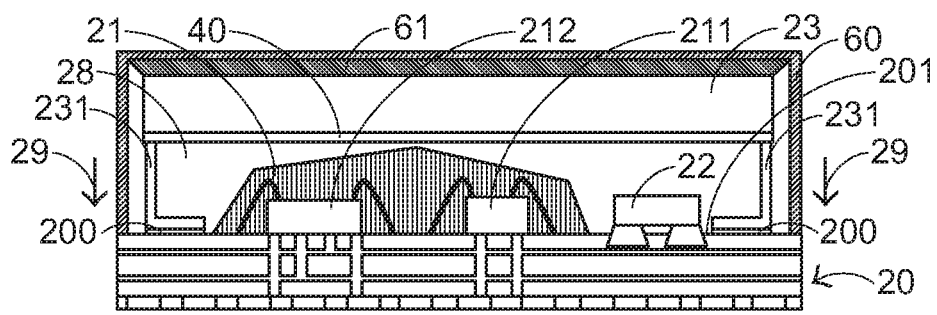
FIG. 6 is a schematic side view illustrating a DC-to-DC converter according to a fifth embodiment of the present invention.

FIG. 6 is a schematic side view illustrating a DC-to-DC converter according to a fifth embodiment of the present invention. In comparison with the third embodiment of FIG. 4, the DC-to-DC converter of FIG. 6 further comprises a thermally-conductive and shielding cover 60 for increasing the heat dissipating efficacy and the EMI shielding efficacy. The thermally-conductive and shielding cover 60 is disposed over the inductor module 23 and attached on the circuit carrier board 20 and the inductor module 23. The thermally-conductive and shielding cover 60 is made of electrically-conductive material in order for isolating or decreasing the influence of the electromagnetic interference (EMI) from the external surroundings on the inductor module 23 and other circuits of the DC-to-DC converter. Moreover, for enhancing the heat dissipating efficacy, the thermally-conductive and shielding cover 60 is adhered onto the inductor module 23 via a thermally-conductive adhesive 61.

Figure 7:
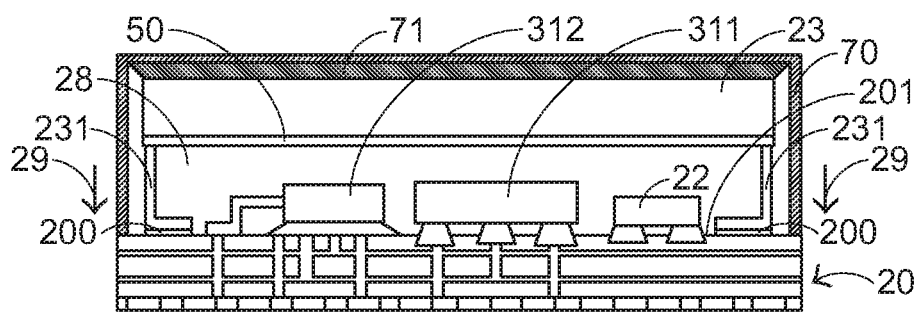
FIG. 7 is a schematic side view illustrating a DC-to-DC converter according to a sixth embodiment of the present invention.

FIG. 7 is a schematic side view illustrating a DC-to-DC converter according to a sixth embodiment of the present invention. In comparison with the fourth embodiment of FIG. 5, the DC-to-DC converter of FIG. 7 further comprises a thermally-conductive and shielding cover 70 for increasing the heat dissipating efficacy and the EMI shielding efficacy. The thermally-conductive and shielding cover 70 is disposed over the inductor module 23 and attached on the circuit carrier board 20 and the inductor module 23. The thermally-conductive and shielding cover 70 is made of electrically-conductive in order for isolating or decreasing the influence of the electromagnetic interference (EMI) from the external surroundings on the inductor module 23 and other circuits of the DC-to-DC converter. Moreover, for enhancing the heat dissipating efficacy, the thermally-conductive and shielding cover 70 is adhered onto the inductor module 23 via a thermally-conductive adhesive 71.

Figure 8:
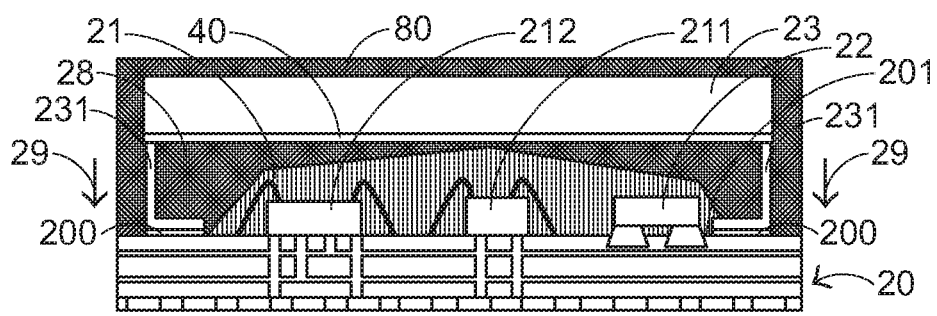
FIG. 8 is a schematic side view illustrating a DC-to-DC converter according to a seventh embodiment of the present invention.

FIG. 8 is a schematic side view illustrating a DC-to-DC converter according to a seventh embodiment of the present invention. In comparison with the third embodiment of FIG. 4, the inductor module 23, the semiconductor module 21 and the passive component 22 are encapsulated with an encapsulant resin 80 by a plastic molding process. As such, the inductor module 23, the semiconductor module 21 and the passive component 22 are fixed on the first surface 201 of the circuit carrier board 20.

Figure 9:
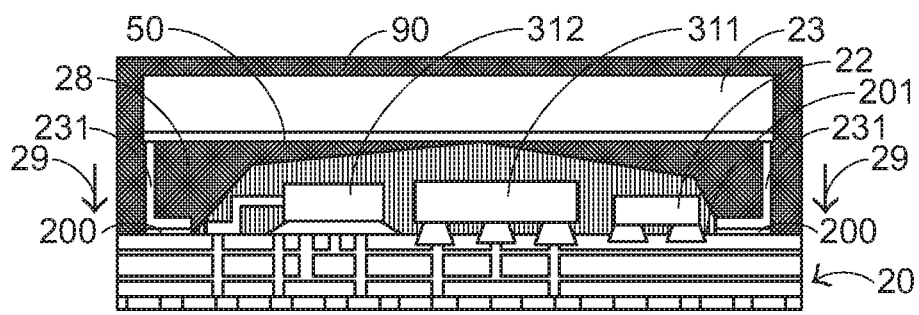
FIG. 9 is a schematic side view illustrating a DC-to-DC converter according to an eighth embodiment of the present invention.

FIG. 9 is a schematic side view illustrating a DC-to-DC converter according to an eighth embodiment of the present invention. In comparison with the fourth embodiment of FIG. 5, the inductor module 23, the semiconductor module 21 and the passive component 22 are encapsulated with an encapsulant resin 90 by a plastic molding process. As such, the inductor module 23, the semiconductor module 21 and the passive component 22 are fixed on the first surface 201 of the circuit carrier board 20.

Although the DC-to-DC converter described in the above embodiments has increased heat dissipating efficacy and/or increased EMI shielding efficacy, the DC-to-DC converter needs to be further improved. For example, if the inductor module 23, the semiconductor module 21 and the passive component 22 fail to withstand the high temperature, during the horizontal part of the L-shaped pin 231 is soldered on a corresponding bonding pad 200 of the first surface 201 of the circuit carrier board 20, these components are readily damaged from the high soldering temperature. For solving this drawback, the improvement of the DC-to-DC converter will be illustrated with reference to FIGS. 10 and 11.

Figure 10:
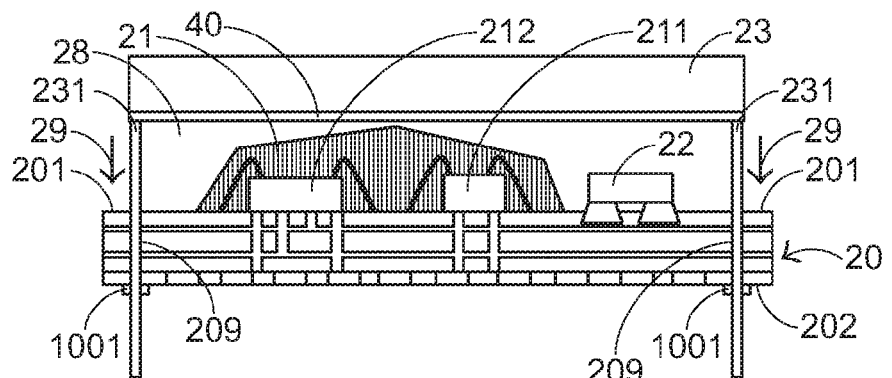
FIG. 10 is a schematic side view illustrating a DC-to-DC converter according to a ninth embodiment of the present invention.
Figure 11:
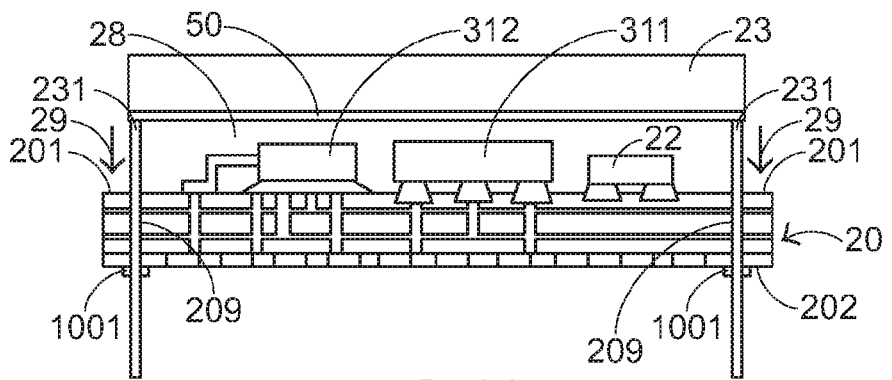
FIG. 11 is a schematic side view illustrating a DC-to-DC converter according to a tenth embodiment of the present invention.

FIG. 10 is a schematic side view illustrating a DC-to-DC converter according to a ninth embodiment of the present invention. FIG. 11 is a schematic side view illustrating a DC-to-DC converter according to a tenth embodiment of the present invention. In comparison with the third and fourth embodiments of FIGS. 4 and 5, the circuit carrier board 20 of the DC-to-DC converter of each of FIG. 10 and FIG. 11 has plural perforations 209. The plural perforations 209 run through the circuit carrier board 20 such that the first surface 201 is in communication with the second surface 202. In addition, plural bonding pads 1001 are formed on the second surface 202 of the circuit carrier board 20 and aligned with corresponding perforations 209. In this embodiment, the pins 231 of the inductor module 23 are linear pins. The pins 231 of the inductor module 23 are penetrated through the perforations 209 and soldered on the corresponding bonding pads 231. In an embodiment, the pins 231 are soldered on the corresponding bonding pads 231 by a wave soldering process. Since the high temperature soldering process is performed on the second surface 202 of the circuit carrier board 20. The electronic components on the first surface 201 of the circuit carrier board 20 are no longer damaged from the high soldering temperature.

Figure 12:
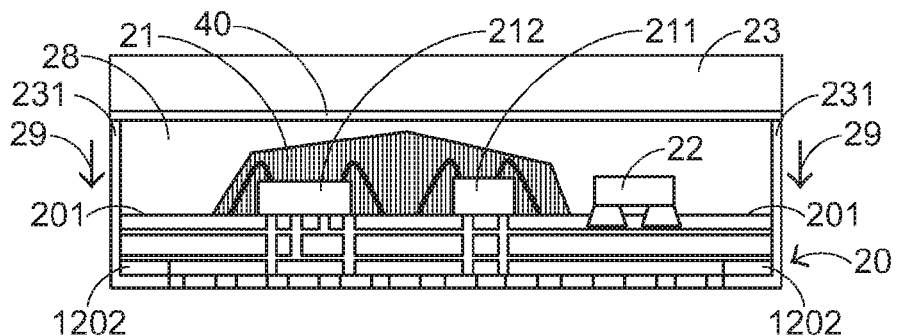
FIG. 12 is a schematic side view illustrating a DC-to-DC converter according to an eleventh embodiment of the present invention.
Figure 13:
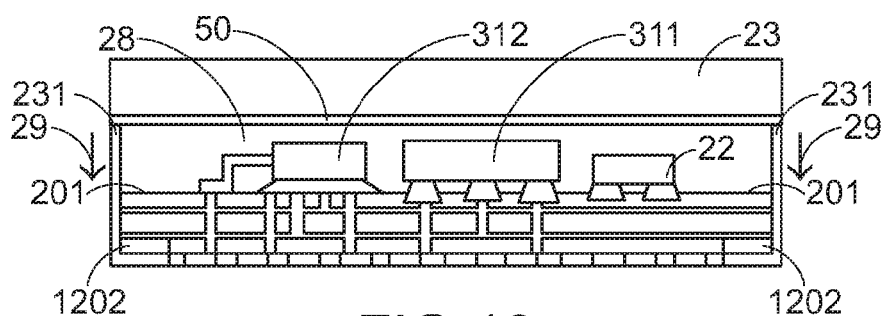
FIG. 13 is a schematic side view illustrating a DC-to-DC converter according to a twelfth embodiment of the present invention.

FIG. 12 is a schematic side view illustrating a DC-to-DC converter according to an eleventh embodiment of the present invention. FIG. 13 is a schematic side view illustrating a DC-to-DC converter according to a twelfth embodiment of the present invention. In comparison with the ninth and tenth embodiments of FIGS. 10 and 11, the perforations 209 are omitted in the DC-to-DC converter of each of FIG. 12 and FIG. 13. The bonding pads 1202 are also formed on the second surface 202 of the circuit carrier board 20. In this embodiment, the pins 231 are L-shaped pins with respective horizontal parts and respective vertical parts. The vertical parts are parallel with the first direction 29. The horizontal parts of the L-shaped pins 231 are soldered on corresponding bonding pads 200. Since the high temperature soldering process is performed on the second surface 202 of the circuit carrier board 20. The electronic components on the first surface 201 of the circuit carrier board 20 are no longer damaged from the high soldering temperature.

The configurations of the DC-to-DC converters as shown in FIGS. 10-13 may be modified or varied according to the practical requirements. For example, the circuit carrier board 20 may be only used to increase the mechanical connection strength. That is, no bonding pads are mounted on the circuit carrier board 20 to electrically connect the circuit carrier board 20 with the inductor module 23; but the pins 231 are directly soldered on the circuit carrier board 20 to combine the inductor module 23 with the circuit carrier board 20. The pins 231 penetrating through the perforations 209 or the pins 231 passing through the edges of the circuit carrier board 20 may be electrically connected with an application side circuit (not shown). In this situation, no additional circuit is needed to be formed on the circuit carrier board 20, but an extra heat-dissipating path is created.

Figure 14A:
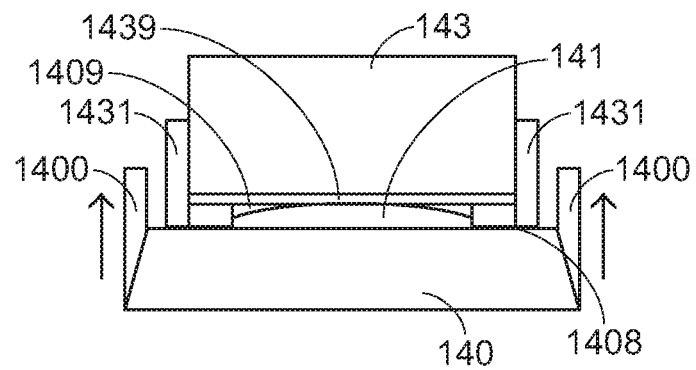
FIGS. 14A and 14B are schematic side views illustrating a DC-to-DC converter according to a thirteenth embodiment of the present invention.
Figure 14B:
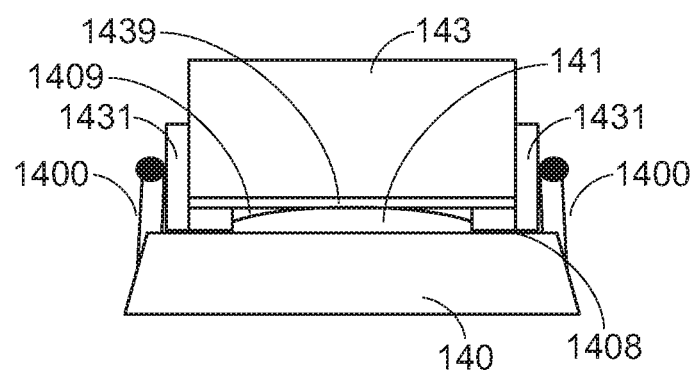

FIGS. 14A and 14B are schematic side views illustrating a DC-to-DC converter according to a thirteenth embodiment of the present invention. In this embodiment, the inductor module 143 has no long pins. Whereas, the inductor module 143 has external bonding pads 1431. In addition, plural pins 1400 are extended from the circuit carrier board 140 along a first direction indicated as the arrow. The semiconductor module 141 is mounted on the first surface 1401 of the circuit carrier board 140. After the inductor module 143 is placed on the circuit carrier board 140, the pins 1400 of the circuit carrier board 140 are bent in the direction toward the inductor module 143 to clamp the inductor module 143. The resulting structure of the DC-to-DC converter is shown in FIG. 14B. Optionally, the pins 1400 and the corresponding bonding pads 1431 are electrically connected with each other via an electrically-conductive adhesive or by a laser bonding process. Meanwhile, a receptacle 1409 is defined between the inductor module 143 and the circuit carrier board 140 for accommodating the semiconductor module 141. Of course, for effectively reducing the influence of the electromagnetic interference (EMI), a shielding layer 1439 is formed on a surface of the inductor module 143 facing the receptacle 1409. The shielding layer 1409 is a metallic sheet made of electromagnetic shielding material.

Figure 15A:
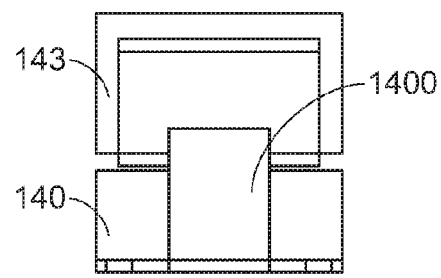
FIGS. 15A, 15B, 15C and 15D are schematic views illustrating four exemplary pins used in the DC-to-DC converter of the thirteenth embodiment of the present invention.
Figure 15B:
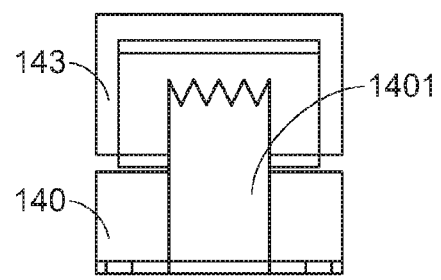
Figure 15C:
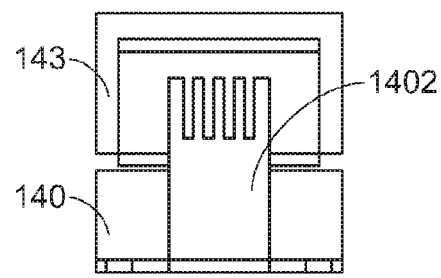
Figure 15D:
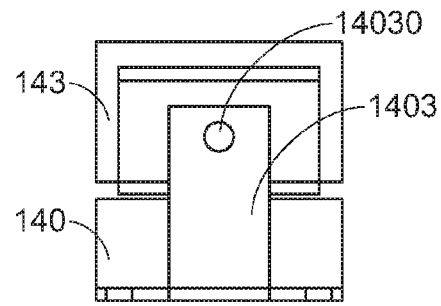

For increasing the bonding strength, the pins 1400 used in the DC-to-DC converter of the thirteenth embodiment of the present invention may be further improved. FIGS. 15A, 15B, 15C and 15D are schematic views illustrating four exemplary pins used in the DC-to-DC converter of the thirteenth embodiment of the present invention. As shown in FIG. 15A, the pin 1400 is a flat pin. As shown in FIG. 15B, the pin 1402 has a saw-tooth region. As shown in FIG. 15C, the pin 1403 has a comb-like region. As shown in FIG. 15D, the pin 1404 has an opening 1403.

From the above description, the DC-to-DC converter of the present invention can effectively solve the drawbacks encountered from the prior art. The concepts of the present invention may be used to assemble any other electronic device similar to the power conversion module. To sum up, the DC-to-DC converter of the present invention is capable of simplifying the assembling process, reducing the electromagnetic interference (EMI) and avoiding thermal damage.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A power conversion module, comprising:
   a circuit carrier board having a plurality of pads;
   a semiconductor module disposed on a first surface of the circuit carrier board; and
   an inductor module having a body and a plurality of pins, wherein a first portion of each of the plurality of pins is in contact with the body of the inductor module, and a second portion of each of the plurality of pins is respectively in contact with and electrically connected to a corresponding pad on the circuit carrier board, wherein the semiconductor module is located between the inductor module and the circuit carrier board, wherein a shielding layer is formed on a surface of the inductor module facing the semiconductor module, and the shielding layer is a metallic sheet.

2. The power conversion module according to claim 1 wherein the circuit carrier board is a printed circuit board, a metal core printed circuit board, a ceramic substrate or a direct bond copper substrate.

3. The power conversion module according to claim 1 wherein the plurality of pads are formed on the first surface of the circuit carrier board, and the plurality of pins of the inductor module are L-shaped pins with respective horizontal parts and respective vertical parts, wherein the horizontal parts of the plurality of pins are soldered on corresponding pads.

4. The power conversion module according to claim 1 wherein the power conversion module further comprises a thermally-conductive and shielding cover, wherein the thermally-conductive and shielding cover encapsulates the inductor module and the circuit carrier board, wherein the thermally-conductive and shielding cover is made of electrically-conductive material and adhered onto the inductor module via a thermally-conductive adhesive.

5. The power conversion module according to claim 1 wherein the semiconductor module is mounted on the first surface of the circuit carrier board by a plastic molding process.

6. The power conversion module according to claim 1 wherein the semiconductor module and the inductor module are mounted on the first surface of the circuit carrier board by a plastic molding process.

7. A power conversion module, comprising:
   a circuit carrier board having plural perforations, wherein a first surface and a second surface of the circuit carrier board are in communication with each other through the perforations;
   a semiconductor module disposed on the first surface of the circuit carrier board; and
   an inductor module having a body and a plurality of pins, wherein a first portion of each of the plurality of pins is in contact with the body of the inductor module, and a second portion of each of the plurality of pins respectively penetrates through a corresponding perforation, wherein said second portion of each pin is in contact with and electrically connected to the circuit carrier board, wherein the semiconductor module is located between the inductor module and the circuit carrier board, wherein a shielding layer is formed on a surface of the inductor module facing the semiconductor module, and the shielding layer is a metallic sheet.

8. A power conversion module, comprising:
   a circuit carrier board having a first surface and a second surface;
   a semiconductor module disposed on a first surface of the circuit carrier board; and
   an inductor module having a body and a plurality of L-shaped pins with respective horizontal parts and respective vertical parts, wherein a top portion of each of the vertical parts of the plurality of L-shaped pins is in contact with the body of the inductor module, and each of the horizontal parts of the plurality of L-shaped pins is in contact with and soldered on the second surface of the circuit carrier board, wherein the semiconductor module is located between the inductor module and the circuit carrier board, wherein a shielding layer is formed on a surface of the inductor module facing the semiconductor module, and the shielding layer is a metallic sheet.

9. The power conversion module according to claim 8 wherein the plurality of L-shaped pins are soldered on the second surface of the circuit carrier board by a wave soldering process.

10. A power conversion module, comprising:
    a circuit carrier board having a plurality of pads;
    a semiconductor module disposed on a first surface of the circuit carrier board; and
    an inductor module having a plurality of pins, each of the plurality of pins extends towards the circuit carrier board and is respectively in contact with and electrically connected to a corresponding pad on the circuit carrier board, wherein the semiconductor module is located between the inductor module and the circuit carrier board, wherein a shielding layer is formed on a surface of the inductor module facing the semiconductor module, and the shielding layer is a metallic sheet.

11. A power conversion module, comprising:
    a circuit carrier board having a plurality of pads;
    a semiconductor module disposed on a first surface of the circuit carrier board;
    an inductor module having a plurality of pins, each of the plurality of pins extends towards the circuit carrier board and is respectively in contact with and electrically connected to a corresponding pad on the circuit carrier board, wherein the semiconductor module is located between the inductor module and the circuit carrier board; and a thermally-conductive and shielding cover, wherein the thermally-conductive and shielding cover encapsulates the inductor module and the circuit carrier board, wherein the thermally-conductive and shielding cover is made of electrically-conductive material and adhered onto the inductor module via a thermally-conductive adhesive.

* * * * *